(12) United States Patent
Nakahara et al.

(10) Patent No.: US 6,310,517 B1
(45) Date of Patent: Oct. 30, 2001

(54) MICROWAVE AMPLIFIER

(75) Inventors: Kazuhiko Nakahara; Yasushi Itoh, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/447,041

(22) Filed: Nov. 23, 1999

(30) Foreign Application Priority Data

Jun. 30, 1999 (WO) .................................. PCT/JP99/03516

(51) Int. Cl.[7] ........................................................ H03F 3/16
(52) U.S. Cl. ........................... 330/277; 330/283; 330/302
(58) Field of Search ................................... 330/277, 283, 330/286, 302

(56) References Cited

U.S. PATENT DOCUMENTS

| 4,390,851 | * | 6/1983 | Higgins et al. | 330/277 |
| 4,751,562 | * | 6/1988 | Yamamura | 357/51 |
| 5,305,469 | * | 4/1994 | Camiade et al. | 455/78 |
| 5,374,899 | * | 12/1994 | Griffiths et al. | 330/277 |
| 5,642,080 | * | 6/1997 | Whang et al. | 330/277 |

FOREIGN PATENT DOCUMENTS

| 6082824 | 6/1985 | (JP) . |
| 61285811 | 12/1986 | (JP) . |
| 6347610 | 3/1988 | (JP) . |
| 63219210 | 9/1988 | (JP) . |
| 575361 | 3/1993 | (JP) . |
| 6077749 | 3/1994 | (JP) . |
| 6188643 | 7/1994 | (JP) . |
| 6276038 | 9/1994 | (JP) . |

OTHER PUBLICATIONS

Nakayama, M., et al., "Low–Noise Amplifier Using Directly Cooled HEMTs", Technical Report of IEICE, MW 92–149, 1993, pp. 49–54.

* cited by examiner

Primary Examiner—Robert Pascal
Assistant Examiner—Henry Choe
(74) Attorney, Agent, or Firm—Rothwell, Figg, Ernst & Manbeck

(57) ABSTRACT

A microwave amplifier (10) of the present invention contains such an arrangement that both an inductor (12) and a resistor (13) are loaded in a parallel manner between a source electrode of a field-effect transistor (11) and the ground. Since the inductor (12) has a stray capacitance component (B), the inductor (12) is resonated at a resonant frequency "f0". However, since the source electrode of the field-effect transistor (11) is grounded via a resistor (13) connected in parallel to the inductor (12), even when the inductor (12) is opened due to a resonant operation, the field-effect transistor (11) is operated under normal condition. As a result, the operation of the microwave amplifier (10) is stabilized.

2 Claims, 12 Drawing Sheets

30: MICROWAVE AMPLIFIER
31: FET
32: INDUCTOR
33: STABILIZING CIRCUIT
34: INDUCTOR
35: CAPACITOR
36: RESONANT UNIT
37: RESISTOR

10: MICROWAVE AMPLIFIER
11: FET
12: INDUCTOR
13: RESISTOR

10: MICROWAVE AMPLIFIER
11: FET
12: INDUCTOR
13: RESISTOR
14: PARALLEL RESONANT CIRCUIT

20: MICROWAVE AMPLIFIER
21: FET
22: INDUCTOR
23: STABILIZING CIRCUIT
24: RESISTOR
25: INDUCTOR

20: MICROWAVE AMPLIFIER
21: FET
22: INDUCTOR
23: STABILIZING CIRCUIT
24: RESISTOR
25: INDUCTOR
26: PARALLEL RESONANT CIRCUIT
27: PARALLEL RESONANT CIRCUIT

- 30: MICROWAVE AMPLIFIER
- 31: FET
- 32: INDUCTOR
- 33: STABILIZING CIRCUIT
- 34: INDUCTOR
- 35: CAPACITOR
- 36: RESONANT UNIT
- 37: RESISTOR

- 30: MICROWAVE AMPLIFIER
- 31: FET
- 32: INDUCTOR
- 33: STABILIZING CIRCUIT
- 34: INDUCTOR
- 35: CAPACITOR
- 36: RESONANT UNIT
- 37: RESISTOR
- 38: PARALLEL RESONANT CIRCUIT
- 39: PARALLEL RESONANT CIRCUIT

| 40: | MICROWAVE AMPLIFIER | 44: | INDUCTOR |
| 41: | FET | 45: | CAPACITOR |
| 42: | INDUCTOR | 46: | RESONANT UNIT |
| 43: | STABILIZING CIRCUIT | 47: | RESISTOR |

| 40: | MICROWAVE AMPLIFIER | 45: | CAPACITOR |
| 41: | FET | 46: | RESONANT UNIT |
| 42: | INDUCTOR | 47: | RESISTOR |
| 43: | STABILIZING CIRCUIT | 48: | PARALLEL RESONANT CIRCUIT |
| 44: | INDUCTOR | 49: | SERIAL RESONANT CIRCUIT |

- 50: MICROWAVE AMPLIFIER
- 51: FET
- 52: INDUCTOR
- 53: STABILIZING CIRCUIT
- 54: RESISTOR
- 55: SHORT STUB

- 50: MICROWAVE AMPLIFIER
- 51: FET
- 52: INDUCTOR
- 53: STABILIZING CIRCUIT
- 54: RESISTOR
- 55: SHORT STUB
- 56: PARALLEL RESONANT CIRCUIT

- 60: MICROWAVE AMPLIFIER
- 61: FET
- 62: INDUCTOR
- 63: STABILIZING CIRCUIT
- 64: RESISTOR
- 65: SHORT STUB

- 60: MICROWAVE AMPLIFIER
- 61: FET
- 62: INDUCTOR
- 63: STABILIZING CIRCUIT
- 64: RESISTOR
- 65: SHORT STUB
- 66: PARALLEL RESONANT CIRCUIT

- 70: MICROWAVE AMPLIFIER
- 71: FET
- 72: INDUCTOR
- 73: RESISTOR
- 74: OPEN STUB

- 70: MICROWAVE AMPLIFIER
- 71: FET
- 72: INDUCTOR
- 73: RESISTOR
- 74: OPEN STUB
- 75: PARALLEL RESONANT CIRCUIT

- 80: MICROWAVE AMPLIFIER
- 81: FET
- 82: INDUCTOR
- 83: RESISTOR
- 84: OPEN STUB

- 80: MICROWAVE AMPLIFIER
- 81: FET
- 82: INDUCTOR
- 83: RESISTOR
- 84: OPEN STUB
- 85: PARALLEL RESONANT CIRCUIT

- 90: MICROWAVE AMPLIFIER
- 91: FET
- 92: INDUCTOR
- 93: RESISTOR
- 94: BIAS CIRCUIT
- 95: RF CHOKE INDUCTOR
- 96: BYPASS CAPACITOR
- 97: BIAS TERMINAL

- 90: MICROWAVE AMPLIFIER
- 91: FET
- 92: INDUCTOR
- 93: RESISTOR
- 94: BIAS CIRCUIT
- 95: RF CHOKE INDUCTOR
- 96: BYPASS CAPACITOR
- 97: BIAS TERMINAL
- 98: PARALLEL RESONANT CIRCUIT

- 100: MICROWAVE AMPLIFIER
- 101: FET
- 102: INDUCTOR
- 103: RESISTOR
- 104: BIAS CIRCUIT
- 105: RF CHOKE INDUCTOR
- 106: BYPASS CAPACITOR
- 107: BIAS TERMINAL

- 100: MICROWAVE AMPLIFIER
- 101: FET
- 102: INDUCTOR
- 103: RESISTOR
- 104: BIAS CIRCUIT
- 105: RF CHOKE INDUCTOR
- 106: BYPASS CAPACITOR
- 107: BIAS TERMINAL
- 108: PARALLEL RESONANT CIRCUIT

110: MICROWAVE AMPLIFIER
111: FET
112: RESISTOR
113: CONNECTION CONDUCTOR
114: TIP OPEN STUB

110: MICROWAVE AMPLIFIER
111: FET
112: RESISTOR
113: CONNECTION CONDUCTOR
114: TIP OPEN STUB

120: LOW NOISE AMPLIFIER
121: FET
122: INDUCTOR

120: LOW NOISE AMPLIFIER
121: FET
122: INDUCTOR

MICROWAVE AMPLIFIER

TECHNICAL FIELD

The present invention is related to a microwave amplifier arranged by employing a field-effect transistor.

BACKGROUND OF THE INVENTION

In general, a conventional microwave amplifier is known from, for example, Japanese Patent Laid-open No. 285811/1986. This first prior art will how be explained with reference to FIG. 21.

In this drawing, reference numeral 110 shows a microwave amplifier; reference numeral 111 indicates a field-effect transistor (will be referred to as an "FET"); reference numeral 112 represents a resistor; and reference numeral 113 shows a connection conductor for connecting the FET 111 to the ground plane. This connection conductor 113 functions as a tip shortcircuit stub which contains an inductance component in a high frequency field. Also, reference numeral 114 represents a tip open stub, the length of which is equal to a ¼ wavelength at an operating frequency of the circuit. Specifically, the ¼ wavelenghth means a ¼ of a wavelength. The wavelength corresponds to the operating frequency of the circuit.

As indicated in FIG. 22, since the connection conductor 113 owns the inductance component "A", the FET 111 can be grounded by employing only the connection conductor 113 at a low frequency under which the inductance component "A" is negligible. However, the inductance component "A" is not negligible in a high frequency, and thus, a gain of the FET 111 is deteriorated. As a consequence, it is possible to avoid such a gain deterioration of the FET 111 by employing the tip open stub 114 so as to ground the FET 111 in the high frequency sense. Also, at this stage, in order to suppress unwanted oscillation of the FET 111, the resistor 112 is connected.

Next, a description will now be made of a second prior art with reference to FIG. 23. FIG. 23 is the diagram for representing the low noise amplifier described in "HEMT DIRECT COOLING TYPE LOW NOISE AMPLIFIER", SHINGAKU GIHO MW 92-149, Japanese Electronic Information Communication Institute. In this drawing, reference numeral 120 indicates a low noise amplifier; reference numeral 121 represents an FET; and reference numeral 122 shows an inductor. A source electrode of the FET 121 is grounded via the inductor 122. As a result, the input impedance for minimizing noise of the FET 121 can be located in the vicinity of the impedance for minimizing the reflection, and also both the noise figure and the reflection coefficient on the input side can be improved at the same time.

On the other hand, any of the above-described prior art owns the below-mentioned problems. First, the microwave amplifier 110 corresponding to the first prior art owns such a problem that unnecessary electric power is consumed by the resistor 112 connected to the source electrode of the FET 111, and thus, the output power characteristic would be deteriorated. Also, as shown in FIG. 24, the low noise amplifier 120 corresponding to the second prior art owns such a problem that since the inductor 122 connected to the source electrode of the FET 121 owns the stray capacitance "B", this inductor is resonated at a predetermined frequency, and thus, operation would become unstable.

The present invention has an object to solve these problems.

DISCLOSURE OF THE INVENTION

A microwave amplifier, according to the present invention, is featured by such a microwave amplifier arranged by employing a field-effect transistor, wherein: both an inductor and a resistor are loaded in a parallel manner between a source electrode of the field-effect transistor and the ground.

Also, a microwave amplifier, according to the present invention, is featured by such a microwave amplifier arranged by employing a field-effect transistor, wherein: a first inductor and a stabilizing circuit are loaded in a parallel manner between a source electrode of said field-effect transistor and the ground; and the stabilizing circuit is equipped with a second inductor and a resistor series-connected to the second inductor, the second inductor is resonated at a frequency different from another frequency at which the first inductor is resonated by a stray capacitance component.

Further, a microwave amplifier, according to the present invention, is featured by such a microwave amplifier arranged by employing a field-effect transistor, wherein: a first inductor and a stabilizing circuit are loaded in a parallel manner between a source electrode of the field-effect transistor and the ground; the stabilizing circuit is equipped with a resonant unit in which a second inductor is parallel-connected to a capacitor, and a resistor series-connected to the resonant unit; and the resonant unit is resonated at a frequency different from another frequency at which the first inductor is resonated by a stray capacitance component.

Also, a microwave amplifier, according to the present invention, is featured by such a microwave amplifier arranged by employing a field-effect transistor, wherein: a first inductor and a stabilizing circuit are loaded in a parallel manner between a source electrode of the field-effect transistor and the ground; the stabilizing circuit is equipped with a resonant unit in which a second inductor is series-connected to a capacitor, and a resistor series-connected to the resonant unit; and the resonant unit is resonated at a frequency different from another frequency at which the first inductor is resonated by a stray capacitance component.

Further, a microwave amplifier, according to the present invention, is featured by such a microwave amplifier arranged by employing a field-effect transistor, wherein: an inductor and a stabilizing circuit are loaded in a parallel manner between a source electrode of the field-effect transistor and the ground; the stabilizing circuit is equipped with a short stub and a resistor series-connected to the short stub; and a length of the short stub is equal to a ½ wavelength at a frequency where the inductor is resonated by a stray capacitance component.

Further, a microwave amplifier, according to the present invention, is featured by such a microwave amplifier arranged by employing a field-effect transistor, wherein: an inductor and a stabilizing circuit are loaded in a parallel manner between a source electrode of the field-effect transistor and the ground; and the stabilizing circuit is equipped with a short stub and a resistor series-connected to the short stub; and a length of the short stub is equal to a ¼ wavelength at a frequency different from such a frequency that the inductor is resonated by a stray capacitance component.

Also, a microwave amplifier, according to the present invention, is featured by such a microwave amplifier arranged by employing a field-effect transistor, comprising: an inductor loaded between a source electrode of the field-effect transistor and the ground; a resistor, one end of which is connected to the electrode; and an open stub connected to the Other end of the resistor, the length of which is equal to a ½ wavelength at a frequency where the inductor is resonated by a stray capacitance component.

Further, a microwave amplifier, according to the present invention, is featured by such a microwave amplifier arranged by employing a field-effect transistor, comprising: an inductor loaded between a source electrode of the field-effect transistor and the ground; a resistor, one end of which is connected to the electrode; and an open stub connected to the other end of the resistor, the length of which is equal to a ¼ wavelength at a frequency different from such a frequency that the inductor is resonated by a stray capacitance component.

Also, a microwave amplifier, according to the present invention, is featured by such a microwave amplifier arranged by employing a field-effect transistor, comprising: an inductor loaded between a source electrode of the field-effect transistor and the ground; a resistor connected between a drain electrode of the field-effect transistor and an output terminal; and a bias circuit connected between the drain electrode of the field-effect transistor and the ground.

In this case, the bias circuit is preferably equipped with an RF choke inductor, and a bypass capacitor series-connected to the RF choke inductor.

Further, a microwave amplifier, according to the present invention, is featured by such a microwave amplifier arranged by employing a field-effect transistor, comprising: an inductor loaded between a source electrode of the field-effect transistor and the ground; a resistor connected between a gate electrode of the field-effect transistor and an input terminal; and a bias circuit connected between the input terminal and the ground.

In this case, the bias circuit is equipped with an RF choke inductor, and a bypass capacitor series-connected to the RF choke inductor.

BEST MODE FOR CARRYING OUT THE INVENTION

Referring now to the accompanying drawings, an embodiment mode of the present invention will be described.

EMBODIMENT MODE 1

Figure 1:
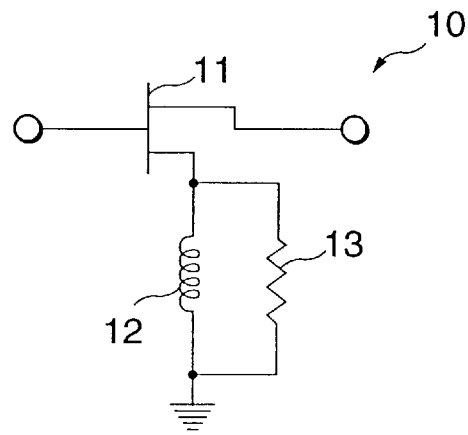
FIG. 1 is a circuit diagram for representing a microwave amplifier according to an embodiment mode 1.

FIG. 1 is a circuit diagram for showing a microwave amplifier according to an embodiment mode 1.

In this drawing, reference numeral 10 indicates a source grounded type microwave amplifier; reference numeral 11 shows an FET; reference numeral 12 represents an inductor loaded between a source electrode of the FET 11 and the ground; and reference numeral 13 indicates a resistor loaded between the source electrode of the FET 11 and the ground and also connected in parallel to the inductor 12.

Next, operations will now be explained. A signal applied to the source electrode is amplified by the FET 11, and then the amplified signal is derived from a drain electrode of the FET 11. Since the inductor 12 is loaded between the source electrode of the FET 11 and the ground, an input impedance capable of minimizing noise of the FET 11 can be located in the vicinity of an impedance capable of minimizing a reflection of the FET 11, and both a noise characteristic and a reflection characteristic can be improved at the same time.

Figure 2:
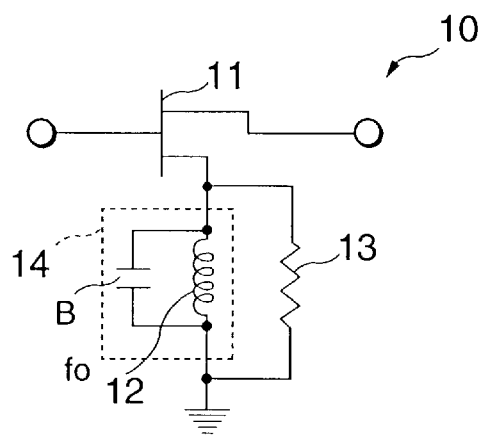
FIG. 2 is an equivalent circuit diagram of the microwave amplifier according to the embodiment mode 1.

Also, since the inductor 12 is formed on either a semiconductor chip or a semiconductor substrate, as shown in FIG. 2, the inductor 12 contains a stray capacitance component B. As a result, the inductor 12 is brought into such a conduction that this inductor 12 is parallel-connected to a capacitor, so that a parallel resonant circuit 14 is constituted. Then, the inductor 12 is resonated at the frequency of "f0" by this stray capacitance component B, and thus, the parallel resonant circuit 14 is brought into an open state. However, since the inductor 12 is loaded in parallel to the resistor 13, the source electrode of the FET 11 can be grounded via the resistor 13, and unwanted oscillation of the FET 11 in the frequency range of the frequency "f0" may be suppressed. As a result, the operation of the microwave amplifier 10 at the resonant frequency "f0" may be stabilized.

It should be understood that the FET 11, the inductor 12, and the resistor 13 may be formed on a single semiconductor substrate, or may be separately formed on independent semiconductor chips. Alternatively, a partially selected element of these FET 11, inductor 12, and resistor 13 may be formed on a semiconductor chip, and other elements may be formed on a semiconductor substrate.

EMBODIMENT MODE 2

Figure 3:
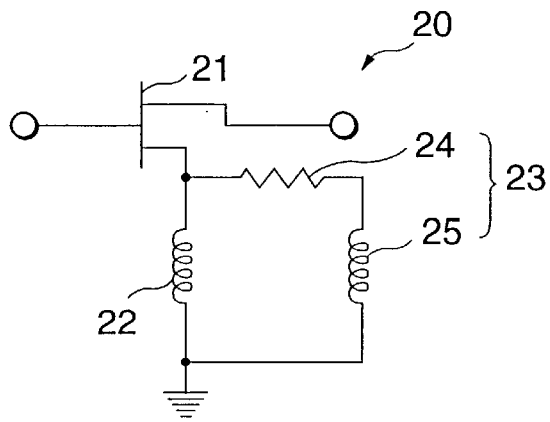
FIG. 3 is a circuit diagram for showing a microwave amplifier according to an embodiment mode 2.

Next, a microwave amplifier according to an embodiment mode 2 will now be explained with reference to FIG. 3. In this drawing, reference numeral 20 shows a source grounded type microwave amplifier; reference numeral 21 indicates an FET; reference numeral 22 represents an inductor (first inductor) loaded between a source electrode of the FET 21 and the ground; and reference numeral 23 indicates a stabilizing circuit loaded between the source electrode of the FET 21 and the ground and also loaded in parallel to the inductor 22. In this case, the stabilizing circuit 23 is equipped with a resistor 24 whose one end is connected to the source electrode of the FET 21, and another inductor (second inductor) 25 connected in series to the other end of the resistor 24.

Next, operations will now be explained. A signal applied to the source electrode is amplified by the FET 21, and then the amplified signal is derived from a drain electrode of the FET 21. Since the inductor 22 is loaded between the source electrode of the FET 21 and the ground, an input impedance capable of minimizing noise of the FET 21 can be located in the vicinity of an impedance capable of minimizing a reflection of the FET 21, and both a noise characteristic and a reflection characteristic can be improved at the same time.

Figure 4:
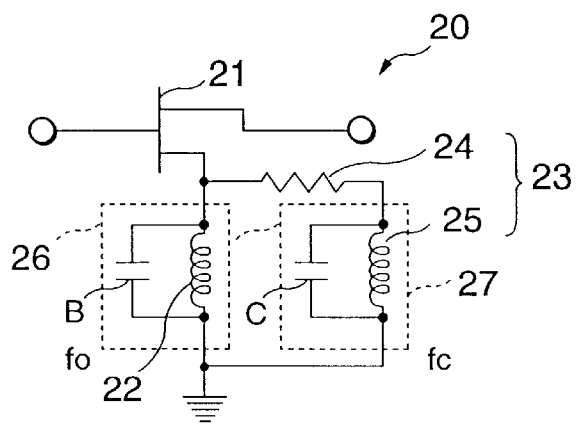
FIG. 4 is an equivalent circuit diagram of the microwave amplifier according to the embodiment mode 2.

Also, since the inductors 22 and 25 are formed on either a semiconductor chip or a semiconductor substrate, as shown in FIG. 4, the inductor 22 contains a stray capacitance component B, and the inductor 25 has a stray capacitance component C (stray capacitances of B and C are different from each other). As a consequence, the inductors 22 and 25 are brought into such a condition that these inductors are connected in parallel to the capacitors, so that a parallel resonant circuit 26 resonated at a frequency "f0" is arranged by the inductor 22 and the stray capacitance component B. Also, another parallel resonant circuit 27 resonated at a frequency "fc" (namely, operating frequency of circuit) different from the frequency "f0" is arranged by the inductor 25 and the stray capacitance component C.

As a consequence, in such a case that the microwave amplifier 20 is used at the frequency "fc", the inductor 22 is operated under normal condition without being resonated. On the other hand, since the inductor 25 is resonated at the frequency "fc", the parallel resonant circuit 27 constructed of the inductor 25 and the stray capacitance component C is brought into an open state.

Therefore, the following equivalent circuit may be constructed. That is, only the inductor 22 is connected to the source electrode of the FET 21.

As a result, at the frequency "fc", the noise matching impedance can be located in the vicinity of the reflection matching impedance by way of the inductor 22, and also both the noise characteristic and the reflection characteristic can be improved at the same time. Also, in this case, since no current will flow through the resistor 24, the power consumption can be suppressed and the output power characteristic can be improved.

Next, in the case that the microwave amplifier 20 is used at the frequency "f0", the inductor 22 is resonated by the stray capacitance component B, and the parallel resonant circuit 26 constructed of the inductor 22 and the stray capacitance component B is brought into an open state. On the other hand, the inductor 25 is operated normally at the frequency "f0" without being resonated. As a consequence, the following equivalent circuit may be constructed. That is, only the resistor 24 and the inductor 25 are connected to the source electrode of the FET 21.

As a result, at the frequency "f0", the source electrode of the FET 21 can be grounded via the resistor 24, and unwanted oscillation of the FET 21 may be suppressed. As a result, the operation of the microwave amplifier 20 at the resonant frequency "f0" may be stabilized.

It should be understood that the FET 21, the inductors 22 and 25, and the resistor 24 may be formed on a single semiconductor substrate, or may be separately formed on independent semiconductor chips. Alternatively, a partially selected element of the se FET 21 , inductors 22 and 25, and resistor 24 may be formed on a semiconductor chip, and other elements may be formed on a semiconductor substrate.

EMBODIMENT MODE 3

Figure 5:
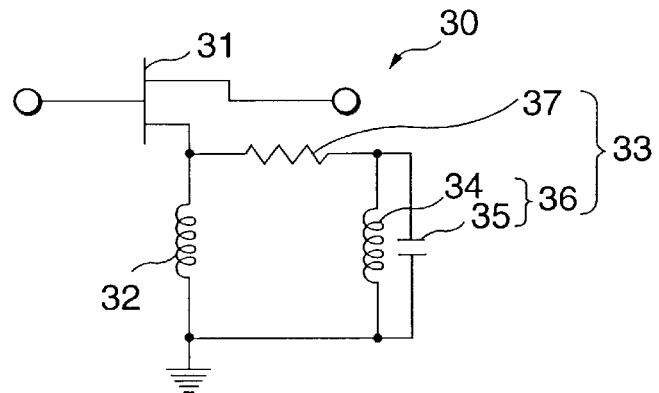
FIG. 5 is a circuit diagram for indicating a microwave amplifier according to an embodiment mode 3.

Next, a microwave amplifier according to an embodiment mode 3 will now be explained with reference to FIG. 5. In this drawing, reference numeral 30 shows a source grounded type microwave amplifier; reference numeral 31 indicates an FET; reference numeral 32 represents an inductor (first inductor) loaded between a source electrode of the FET 31 and the ground; and reference numeral 33 indicates a stabilizing circuit loaded between the source electrode of the FET 31 and the ground and also loaded in parallel to the inductor 32. In this case, the stabilizing circuit 33 is equipped with a resonant unit 36, and a resistor 37. The resonant unit 36 is equipped with an inductor (second inductor) 34 and a capacitor 35 connected in parallel to each other. This resistor 37 is connected in series with the resonant circuit 36.

Next, operations will now be explained. A signal applied to the source electrode is amplified by the FET 31, and then the amplified signal is derived from a drain electrode of the FET 31. Since the inductor 32 is loaded between the source electrode of the FET 31 and the ground, an input impedance capable of minimizing noise of the FET 31 can be located in the vicinity of an impedance capable of minimizing a reflection of the FET 31, and both a noise characteristic and a reflection characteristic can be improved at the same time.

Figure 6:
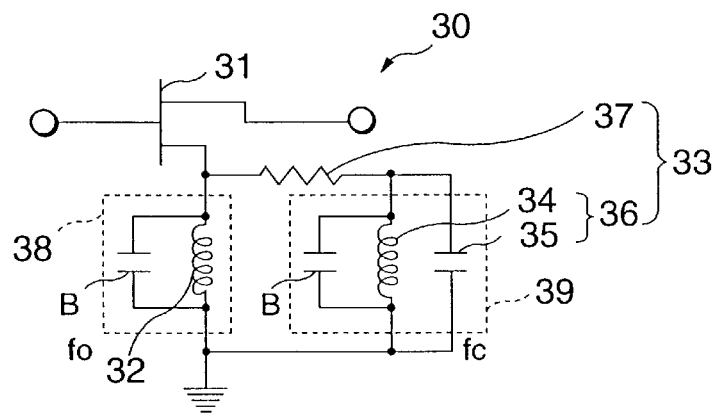
FIG. 6 is an equivalent circuit diagram of the microwave amplifier according to the embodiment mode 3.

Also, since the inductors 32 and 34 are formed on either a semiconductor chip or a semiconductor substrate, as shown in FIG. 6, the inductors 32 and 34 have stray capacitance components B, respectively. As a consequence, the inductors 33 and 34 are brought into such a condition that these inductors are connected in parallel to the capacitors, so that a parallel resonant circuit 38 resonated at a frequency "f0" is arranged by the inductor 32 and the stray capacitance component B. Also, another parallel resonant circuit 39 resonated at a frequency "fc" (namely, operating frequency of circuit) different from the frequency "f0" is arranged by the inductor 34, the stray capacitance component B and capacitor 35.

As a consequence, in such a case that the microwave amplifier 30 is used at the frequency "fc", the inductor 32 is operated under normal condition without being resonated. On the other hand, the parallel resonant circuit 39 constructed of the inductor 34, the stray capacitance component B and capacitor 35 is resonated at the frequency "fc", and is brought into an open state. Therefore, the following equivalent circuit may be constructed. That is, only the inductor 32 is connected to the source electrode of the FET 31.

As a result, at the frequency "fc", the noise matching impedance can be located in the vicinity of the reflection matching impedance by way of the inductor 32, and also both the noise characteristic and the reflection characteristic can be improved at the same time. Also, in this case, since no current will flow through the resistor 37, the power consumption can be suppressed and the output power characteristic can be improved.

Next, in the case that the microwave amplifier 30 is used at the frequency "f0", the inductor 32 is resonated by the stray capacitance component B, and the parallel resonant circuit 38 constructed of the inductor 32 and the stray capacitance component B is brought into an open state. On the other hand, the inductor 34 is operated under normal condition without being resonated at the frequency "f0". As a consequence, the following equivalent circuit may be constructed. That is, only the resistor 37 and the resonant unit 36 are connected to the source electrode of the FET 31.

As a result, at the frequency "f0", the source electrode of the FET 31 can be grounded via the resistor 37, and unwanted oscillation of the FET 31 may be suppressed. As a result, the operation of the microwave amplifier 30 at the resonant frequency "f0" may be stabilized.

It should be noted that in this embodiment mode, since the capacitor 35 is added in parallel to the inductor 34, the resonant frequency of the parallel resonant circuit 39 is adjusted to become "fc". As a result, the inductor 34 may be manufactured in such a manner that this inductor 34 owns the same stray capacitance component B as that of the inductor 32, and the manufacturing step can become simple.

It should be also understood that the FET 31, the inductors 32 and 34, capacitor 35, and the resistor 37 may be formed on a single semiconductor substrate, or may be separately formed on independent semiconductor chips. Alternatively, a partially selected element of these FET 31, inductors 32 and 34, capacitor 35, and resistor 37 may be formed on a semiconductor chip, and other elements may be formed on a semiconductor substrate.

EMBODIMENT MODE 4

Figure 7:
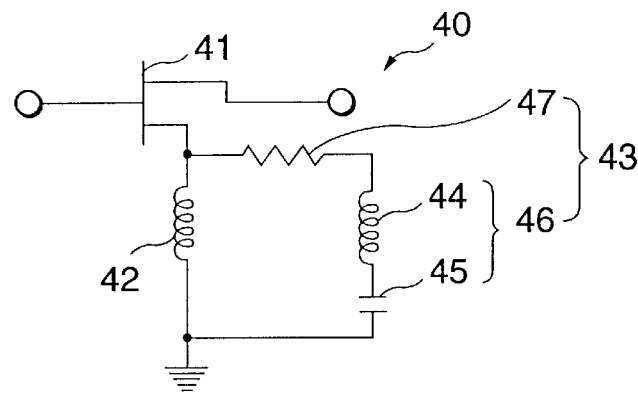
FIG. 7 is a circuit diagram for showing a microwave amplifier according to an embodiment mode 4.

Next, a microwave amplifier according to an embodiment mode 4 will now be explained with reference to FIG. 7. In this drawing, reference numeral 40 shows a source grounded type microwave amplifier; reference numeral 41 indicates an FET; reference numeral 42 represents an inductor (first inductor) loaded between a source electrode of the FET 41 and the ground; and reference numeral 43 indicates a stabilizing circuit loaded between the source electrode of the FET 41 and the ground and also loaded in parallel to the inductor 42. In this case, the stabilizing circuit 43 is equipped with a resonant unit 46, and a resistor 47. The resonant unit 46 is equipped with an inductor (second inductor) 44 and a capacitor 45 connected in series to each other. This resistor 47 is connected in series with the resonant circuit 46.

Next, operations will now be explained. A signal applied to the source electrode is amplified by the FET 41, and then the amplified signal is derived from a drain electrode of the FET 41. Since the inductor 42 is loaded between the source electrode of the FET 41 and the ground, an input impedance capable of minimizing noise of the FET 41 can be located in the vicinity of an impedance capable of minimizing a reflection of the FET 41, and both a noise characteristic and a reflection characteristic can be improved at the same time.

Figure 8:
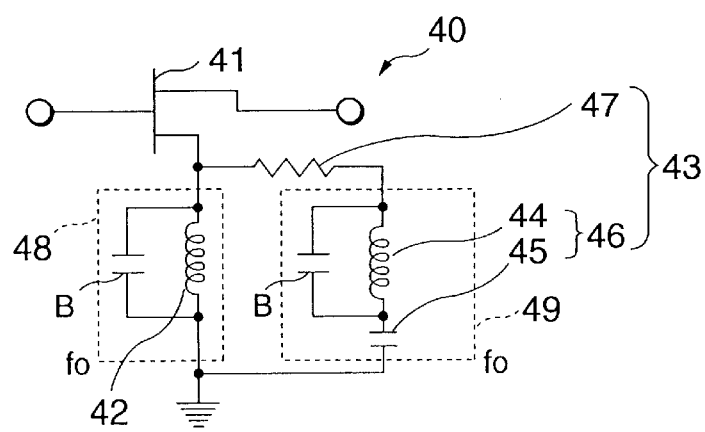
FIG. 8 is an equivalent circuit diagram of the microwave amplifier according to the embodiment mode 4.

Also, since the inductors 42 and 44 are formed on either a semiconductor chip or a semiconductor substrate, as shown in FIG. 8, the inductor 42 contains a stray capacitance component B, and the inductor 44 owns a stray capacitance component C. As a consequence, the inductors 42 and 44 are brought into such a condition that these inductors are connected in parallel to the capacitors, so that a parallel resonant circuit 48 resonated at a frequency "f0" is arranged by the inductor 42 and the stray capacitance component B. Also, a series resonant circuit 49 resonated at the frequency "f0" is arranged by the inductor 44, the capacitor 45, and the stray capacitance component C.

As a consequence, in such a case that the microwave amplifier 40 is used at frequencies other than the frequency "f0", the inductors 42 and 44 are operated under normal condition without being resonated. As a result, at the frequencies other than the frequency "f0", the noise matching impedance can be located in the vicinity of the reflection matching impedance by way of the inductor 42, and also both the noise characteristic and the reflection characteristic can be improved at the same time.

Next, in the case that the microwave amplifier 40 is used at the frequency "f0", the inductor 42 is resonated by the stray capacitance component B, and the parallel resonant circuit 48 constructed of the inductor 42 and the stray capacitance component B is brought into an open state. On the other hand, the series resonant circuit 49 constructed of the inductor 44, the stray capacitance component C, and the capacitor 45 is resonated at the frequency "f0" to be short-circuited. As a consequence, the following equivalent circuit may be constructed. That is, only the resistor 47 is connected to the source electrode of the FET 41.

As a result, at the frequency "f0", the source electrode of the FET 41 can be grounded via the resistor 47, and unwanted oscillation of the FET 41 may be suppressed. As a result, the operation of the microwave amplifier 40 at the resonant frequency "f0" may be stabilized.

It should be understood that the FET 41, the inductors 42 and 44, the capacitor 45, and the resistor 47 may be formed on a single semiconductor substrate, or may be separately formed on independent semiconductor chips. Alternatively, a partially selected element of these FET 41, inductors 42 and 44, the capacitor 45, and resistor 47 may be formed on a semiconductor chip, and other elements may be formed on a semiconductor substrate.

EMBODIMENT MODE 5

Figure 9:
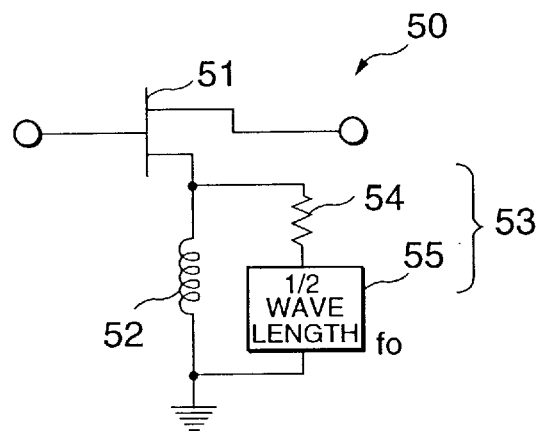
FIG. 9 is a circuit diagram for indicating a microwave amplifier according to an embodiment mode 5.

Next, a microwave amplifier according to an embodiment mode 5 will now be explained with reference to FIG. 9. In this drawing, reference numeral 50 shows a source grounded type microwave amplifier; reference numeral 51 indicates an FET; reference numeral 52 represents an inductor loaded between a source electrode of the FET 51 and the ground; and reference numeral 53 indicates a stabilizing circuit loaded between the source electrode of the FET 51 and the ground and also loaded in parallel to the inductor 52. In this case, the stabilizing circuit 53 is equipped with a resistor 54 whose one end is connected to the source electrode of the FET 51, and a short stub 55 connected in series to the other end of the resistor 54.

Next, operations will now be explained. A signal applied to the source electrode is amplified by the FET 51, and then the amplified signal is derived from a drain electrode of the FET 51. Since the inductor 52 is loaded between the source electrode of the FET 51 and the ground, an input impedance capable of minimizing noise of the FET 51 can be located in the vicinity of an impedance capable of minimizing a reflection of the FET 51, and both a noise characteristic and a reflection characteristic can be improved at the same time.

Figure 10:
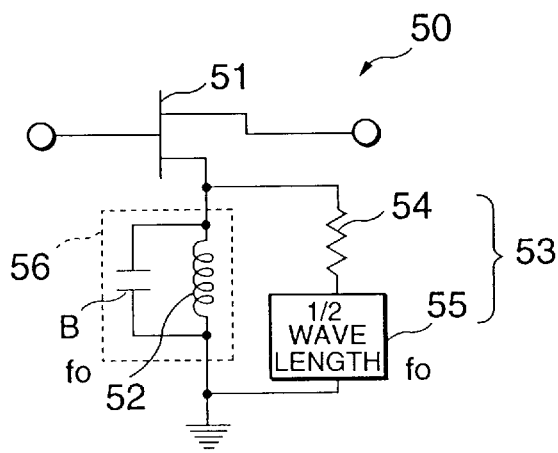
FIG. 10 is an equivalent circuit diagram of the microwave amplifier according to the embodiment mode 5.

Also, since the inductor 52 is formed on either a semiconductor chip or a semiconductor substrate, as shown in FIG. 10, the inductor 52 contains a stray capacitance component B. As a consequence, the inductor 52 is brought into such a condition that this inductor is connected in parallel to the capacitor, so that a parallel resonant circuit 56 resonated at a frequency "f0" is arranged by the inductor 52 and the stray capacitance component B. On the other hand, the short stub 55 is adjusted in such a manner that the length of this short stub 55 is equal to a ½ wavelength at the frequency "f0".

As a consequence, in such a case that the microwave amplifier 50 is used at the frequency "fc" (operating frequency of circuit), the inductor 52 is operated under normal condition without being resonated.

Then, at the frequency "fc", the noise matching impedance can be located in the vicinity of the reflection matching impedance by way of the inductor 52, and also both the noise characteristic and the reflection characteristic can be improved at the same time. Also, in this case, since the short stub 55 becomes a high impedance, the power consumption caused by the resistor 54 can be suppressed and the output power characteristic can be improved.

Next, in the case that the microwave amplifier 50 is used at the frequency "f0", the inductor 52 is resonated by the stray capacitance component B, and the parallel resonant circuit 56 constructed of the inductor 52 and the stray capacitance component B is brought into an open state. On the other hand, the short stub 55 is shortcircuited at the frequency "f0". As a consequence, the following equivalent circuit may be constructed. That is, only the resistor 54 is connected to the source electrode of the FET 51.

As a result, at the frequency "f0", the source electrode of the FET 51 can be grounded via the resistor 54, and unwanted oscillation of the PET 51 may be suppressed. As a result, the operation of the microwave amplifier 50 at the resonant frequency "f0" may be stabilized.

It should be understood that the FET 51, the inductor 52, the short stub 55, and the resistor 54 may be formed on a single semiconductor substrate, or may be separately formed on independent semiconductor chips. Alternatively, a partially selected element of these FET 51, inductor 52, short stub 55, and resistor 54 may be formed on a semiconductor chip, and other elements may be formed on a semiconductor substrate.

EMBODIMENT MODE 6

Figure 11:
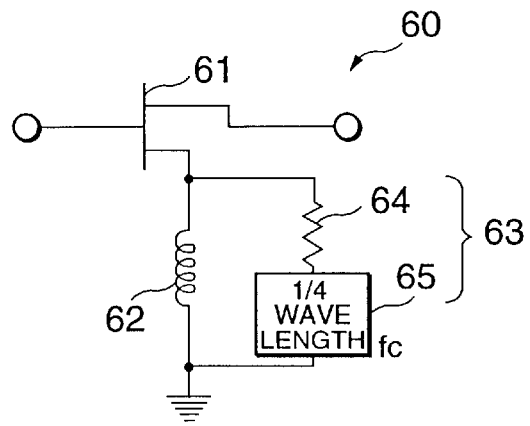
FIG. 11 is a circuit diagram for showing a microwave amplifier according to an embodiment mode 6.

Next, a microwave amplifier according to an embodiment mode 6 will now be explained with reference to FIG. 11. In this drawing, reference numeral 60 shows a source grounded type microwave amplifier; reference numeral 61 indicates an FET; reference numeral 62 represents an inductor loaded between a source electrode of the FET 61 and the ground; and reference numeral 63 indicates a stabilizing circuit loaded between the source electrode of the FET 61 and the ground and also loaded in parallel to the inductor 62. In this case, the stabilizing circuit 63 is equipped with a resistor 64 whose one end is connected to the source electrode of the FET 61, and a short stub 65 connected in series to the other end of the resistor 64.

Next, operations will now be explained. A signal applied to the source electrode is amplified by the FET 61, and then the amplified signal is derived from a drain electrode of the FET 61. Since the inductor 62 is loaded between the source electrode of the FET 61 and the ground, an input impedance capable of minimizing noise of the FET 61 can be located in the vicinity of an impedance capable of minimizing a reflection of the FET 61, and both a noise characteristic and a reflection characteristic can be improved at the same time.

Figure 12:
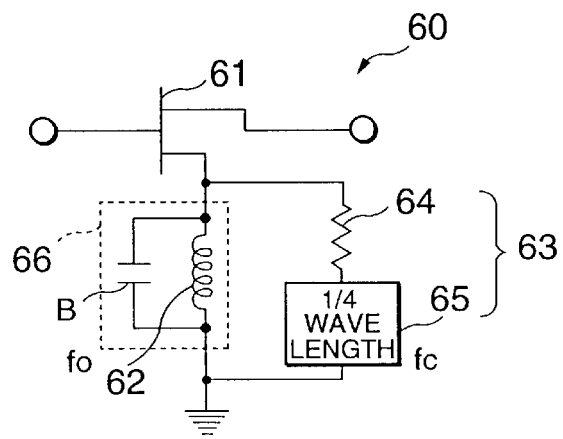
FIG. 12 is an equivalent circuit diagram of the microwave amplifier according to the embodiment mode 6.

Also, since the inductor 62 is formed on either a semiconductor chip or a semiconductor substrate, as shown in FIG. 12, the inductor 62 contains a stray capacitance component B. As a consequence, the inductor 62 is brought into such a condition that this inductor is connected in parallel to the capacitors so that a parallel resonant circuit 66 resonated at a frequency "f0" is arranged by the inductor 62 and the stray capacitance component B. On the other hand, the short stub 65 is adjusted in such a manner that the length of the short stub 65 is equal to a ¼ wavelength a t the frequency "fc" (operating frequency of circuit). As a result, the short stub 65 is brought into an open state of the frequency "fc".

As a consequence, in such a case that the microwave amplifier 60 is used at the frequency "fc", the inductor 62 is operated under normal condition without being resonated.

Then, at the frequency "fc", the noise matching impedance can be located in the vicinity of the reflection matching impedance by way of the inductor 62, and also both the noise characteristic and the reflection characteristic can be improved at the same time. Also, in this case, since the short stub 65 is opened, no current will flow through the resistor 64. Accordingly, the power consumption can be suppressed and the output power characteristic can be improved.

Next, in the case that the microwave amplifier 60 is used at the frequency "f0", the inductor 62 is resonated by the stray capacitance component B, and the parallel resonant circuit 66 constructed of the inductor 62 and the stray capacitance component B is brought into an open state. As a consequence, the following equivalent circuit may be constructed. That is, only the resistor 64 is connected to the source electrode of the FET 61.

As a result, at the frequency "f0", the source electrode of the FET 61 can be grounded via the resistor 64, and unwanted oscillation of the FET 61 may be suppressed. As a result, the operation of the microwave amplifier 60 a t the resonant frequency "f0" may be stabilized. it should be understood that the FET 61, the inductor 62, the resistor 64, and the short stub 65 may be formed on a single semiconductor substrate, or may be separately formed on independent semiconductor chips. Alternatively, a partially selected element of these FET 61, inductor 62, resistor 64, and short stub 65 may be formed on a semiconductor chip, and other elements may be formed on a semiconductor substrate.

EMBODIMENT MODE 7

Figure 13:
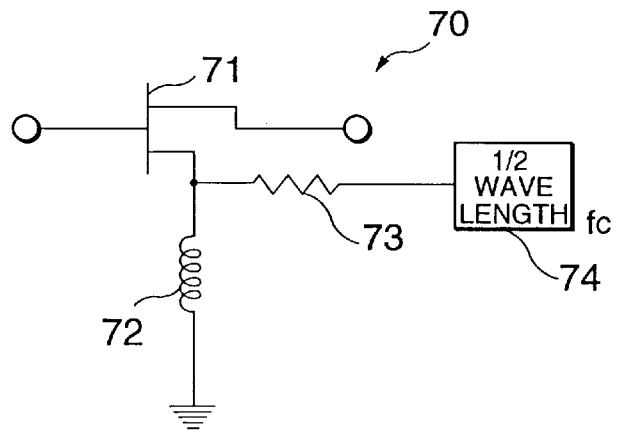
FIG. 13 is a circuit diagram for indicating a microwave amplifier according to an embodiment mode 7.

Next, a microwave amplifier according to an embodiment mode 7 will now be explained with reference to FIG. 13. In this drawing, reference numeral 70 shows a source grounded type microwave amplifier; reference numeral 71 indicates an FET; reference numeral 72 represents an inductor loaded between a source electrode of the FET 71 and the ground; and reference numeral 73 shows a resistor whose one end is connected to the source electrode of the FET 71, and reference numeral 74 is an open stub connected in series to the other end of the resistor 73.

Next, operations will now be explained. A signal applied to the source electrode is amplified by the FET 71, and then the amplified signal is derived from a drain electrode of the FET 71. Since the inductor 72 is loaded between the source electrode of the FET 71 and the ground, an input impedance capable of minimizing noise of the FET 71 can be located in the vicinity of an impedance capable of minimizing a reflection of the FET 71, and both a noise characteristic and a reflection characteristic can be improved at the same time.

Figure 14:
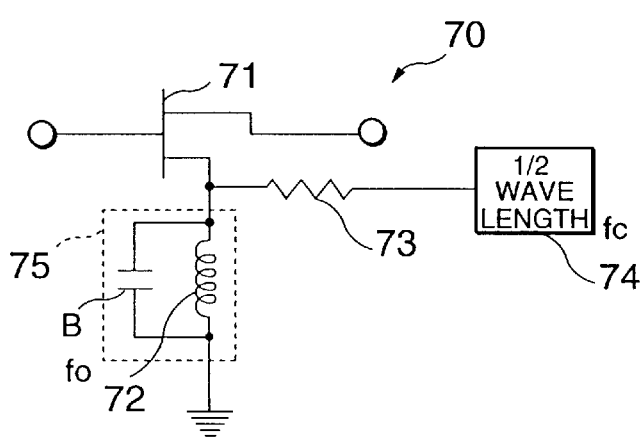
FIG. 14 is an equivalent circuit diagram of the microwave amplifier according to the embodiment mode 7.

Also, since the inductor 72 is formed on either a semiconductor chip or a semiconductor substrate, as shown in FIG. 14, the inductor 72 contains a stray capacitance component B. As a consequence, the inductor 72 is brought into such a condition that this inductor is connected in parallel to the capacitor, so that a parallel resonant circuit 75 resonated at a frequency "f0" is arranged by the inductor 72 and the stray capacitance component B. On the other hand, the open stub 74 is adjusted in such a manner that the length of the open stub 74 is equal to a ½ wavelength at the frequency "fc" (operating frequency of circuit). As a result, the open stub 74 is brought into an open state at the frequency "fc".

As a consequence, in such a case that the microwave amplifier 70 is used at the frequency "fc", the inductor 72 is operated under normal condition without being resonated.

Then, at the frequency "fc", the noise matching impedance can be located in the vicinity of the reflection matching impedance by way of the inductor 72, and also both the noise characteristic and the reflection characteristic can be improved at the same time. Also, in this case, since the open stub 74 is opened, no current will flow through the resistor 73. As a result, the power consumption can be suppressed and the output power characteristic can be improved.

Next, in the case that the microwave amplifier 70 is used at the frequency "f0", the inductor 72 is resonated by the stray capacitance component B, and the parallel resonant circuit 75 constructed of the inductor 72 and the stray capacitance component B is brought into an open state. As a consequence, the following equivalent circuit may be constructed. That is, only the resistor 74 is connected to the source electrode of the FET 71.

As a result, at the frequency "f0", the source electrode of the FET 71 can be grounded via the resistor 74. As a result, the operation of the microwave amplifier 70 at the resonant frequency "f0" may be stabilized.

It should be understood that the FET 71, the inductor 72, the resistor 73, and the open stub 74 may be formed on a single semiconductor substrate, or may be separately formed on independent semiconductor chips. Alternatively, a partially selected element of these FET 71, inductor 72, resistor 73, and open stub 74 may be formed on a semiconductor chip, and other elements may be formed on a semiconductor substrate.

EMBODIMENT MODE 8

Figure 15:
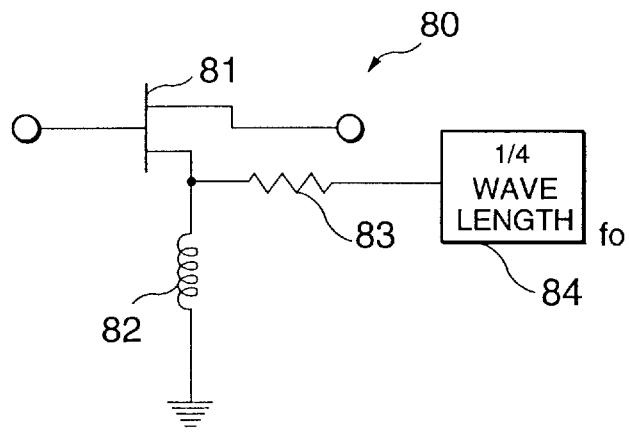
FIG. 15 is a circuit diagram for showing a microwave amplifier according to an embodiment mode 8.

Next, a micro wave amplifier according to an embodiment mode 8 will now be explained with reference to FIG. 15. In this drawing, reference numeral 80 shows a source grounded type microwave amplifier; reference numeral 81 indicates an FET; reference numeral 82 represents an inductor loaded between a source electrode of the FET 81 and the ground; and reference numeral 83 indicates a resistor whose one end is connect ed to the source electrode of the FET 81, and reference numeral 84 is an open stub connected in series to the other end of the resistor 83.

Next, operations will now be explained. A signal applied to the source electrode is amplified by the FET 81, and then the amplified signal is derived from a drain electrode of the FET 81. Since the inductor 82 is loaded between the source electrode of the FET 81 and the ground, an input impedance capable of minimizing noise of the FET 81 can be located in the vicinity of an impedance capable of minimizing a reflection of the FET 81, and both a noise characteristic and a reflection characteristic can be improved at the same time.

Figure 16:
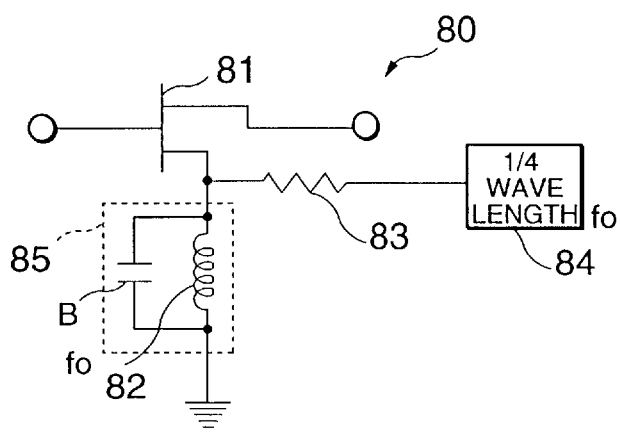
FIG. 16 is an equivalent circuit diagram of the microwave amplifier according to the embodiment mode 8.

Also, since the inductor 82 is formed on either a semiconductor chip or a semiconductor substrate, as shown in FIG. 16, the inductor 82 contains a stray capacitance component B. As a consequence, the inductor 82 is brought into such a condition that this inductor is connected in parallel to the capacitor, so that a parallel resonant circuit 85 resonated at a frequency "f0" is arranged by the inductor 82 and the stray capacitance component B. On the other hand, the open stub 84 is adjusted in such a manner that the length of this open stub 84 is equal to a ¼ wavelength at the frequency "f0". Therefore, the open stub 84 is shortcircuited at the frequency "f0".

As a consequence, in such a case that the microwave amplifier 80 is used at a frequency "fc" (operating frequency of circuit), the inductor 82 is operated under normal condition without being resonated.

Then, at the frequency "fc", the noise matching impedance can be located in the vicinity of the reflection matching impedance by way of the inductor 82, and also both the noise characteristic and the reflection characteristic can be improved at the same time. Also, in this case, since the open stub 84 becomes a high impedance, the power consumption caused by the resistor 83 can be suppressed and the output power characteristic can be improved.

Next, in the case that the microwave amplifier 80 is used at the frequency "f0", the inductor 82 is resonated by the stray capacitance component B, and the parallel resonant circuit 85 constructed of the inductor 82 and the stray capacitance component B is brought into an open state. On the other hand, the open stub 84 is shortcircuited at the frequency "f0". As a consequence, the following equivalent circuit may be constructed. That is, only the resistor 83 is connected to the source electrode of the FET 81.

As a result, at the frequency "f0", the source electrode of the FET 81 can be grounded via the resistor 83, and unwanted oscillation of the FET 81 may be suppressed. As a result, the operation of the microwave amplifier 80 at the resonant frequency "f0" may be stabilized.

It should be understood that the FET 81, the inductor 82, the resistor 83, and the open stub 84 may be formed on a single semiconductor substrate, or may be separately formed on. independent semiconductor chips. Alternatively, a partially selected element of these FET 81, inductor 82, the resistor 83, and open stub 84 may be formed on a semiconductor chip, and other elements may be formed on a semiconductor substrate.

EMBODIMENT MODE 9

Figure 17:
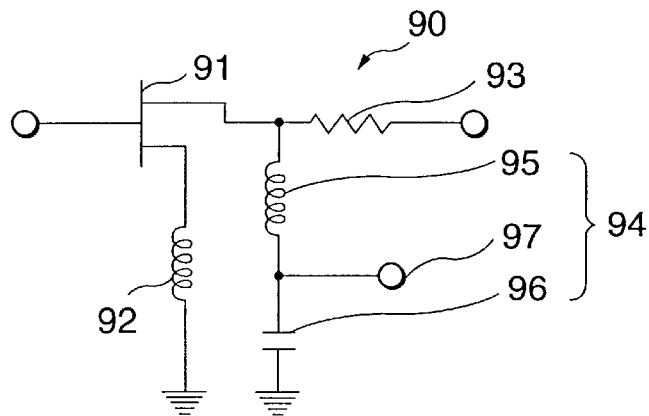
FIG. 17 is a circuit diagram for indicating a microwave amplifier according to an embodiment mode 9.

Next, a microwave amplifier according to an embodiment mode 9 will now be explained with reference to FIG. 17. In this drawing, reference numeral 90 shows a source grounded type microwave amplifier; reference numeral 91 indicates an FET; reference numeral 92 represents an inductor loaded between a source electrode of the FET 91 and the ground; reference numeral 93 indicates a resistor connected between a drain electrode of the FET 91 and an output terminal; and reference numeral 94 represents a bias circuit connected between the drain electrode of the FET 91 and the ground. In this case, the bias circuit 94 is equipped with an RF choke inductor 95, a bypass capacitor 96, and a bias terminal 97. One end of the RF choke inductor 95 is connected to the drain electrode of the FET 91. One end of the bypass capacitor 96 is connected to the RF choke inductor 95, and the other end thereof is grounded. The bias terminal 97 is connected between the RF choke inductor 95 and the bypass capacitor 96.

Next, operations will now be explained. A signal applied to the source electrode is amplified by the FET 91, and then the amplified signal is derived from a drain electrode of the FET 91. Since the inductor 92 is loaded between the source electrode of the FET 91 and the ground, an input impedance capable of minimizing noise of the FET 91 can be located in the vicinity of an impedance capable of minimizing a reflection of the FET 91, and both a noise characteristic and a reflection characteristic can be improved at the same time.

Figure 18:
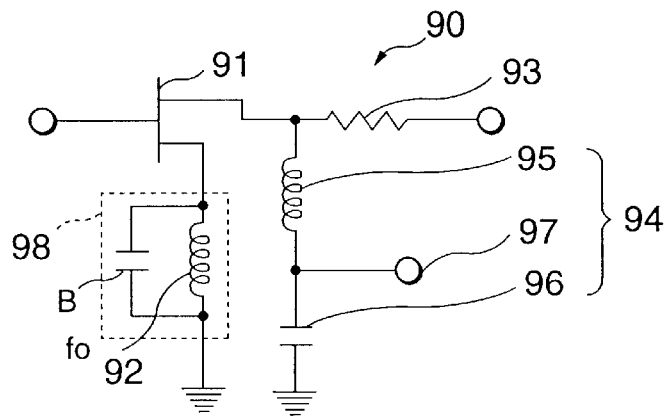
FIG. 18 is an equivalent circuit diagram of the microwave amplifier according to the embodiment mode 9.

Also, since the inductor 92 is formed on either a semiconductor chip or a semiconductor substrate, as shown in FIG. 18, the inductor 92 contain a stray capacitance component B. As a consequence, the inductor 92 is brought into such a condition that this inductor is connected in parallel to the capacitors, so that a parallel resonant circuit 98 resonated at a frequency "f0" is arranged by the inductor 92 and the stray capacitance component B.

As a consequence, in such a case that the microwave amplifier 90 is used at a frequency "f0", the inductor 92 is resonated at the frequency "f0" by the stray capacitance component B, the parallel resonant circuit 98 constructed of the inductor 92 and the stray capacitance component B is brought into an open state. However, since the resistor 93 is series-connected to the drain electrode of the FET 91 and the bias voltage is applied to the drain electrode of the FET 91 from the bias circuit 94, even when the parallel resonant circuit 98 is opened, the operation of the microwave amplifier 90 may be stabilized. Also, since no resistor is connected to the source electrode of the FET 91, an occurrence of noise caused by the resistor connected to the source electrode can be suppressed.

Also, since the resistor 93 is series-connected to the drain electrode of the FET 91, the operation of the microwave amplifier 90 may be stabilized over the entire frequency range without any frequency selection. As a consequence, the microwave amplifier 90 may become such a low noise amplifier operable under stable condition, while the noise characteristic is substantially not deteriorated.

EMBODIMENT MODE 10

Figure 19:
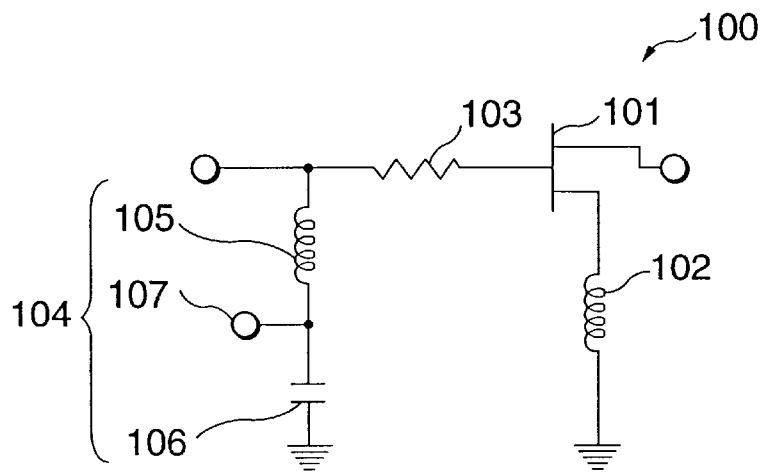
FIG. 19 is a circuit diagram for showing a microwave amplifier according to an embodiment mode 10.
Figure 20:
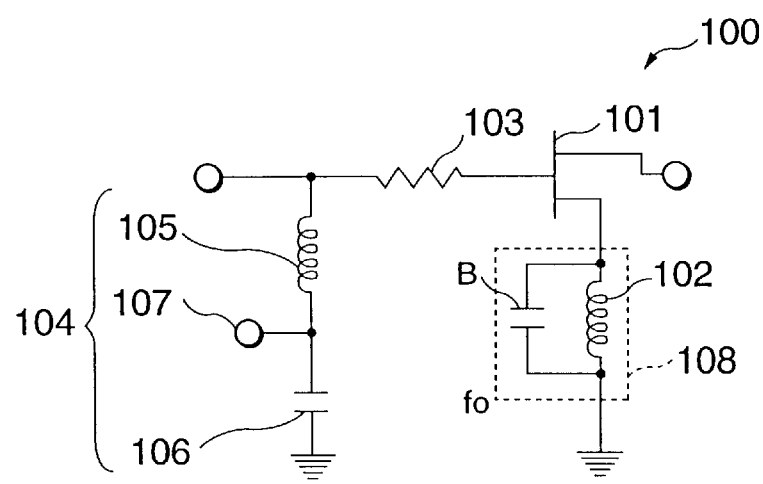
FIG. 20 is an equivalent circuit diagram of the microwave amplifier according to the embodiment mode 10.
Figure 21:
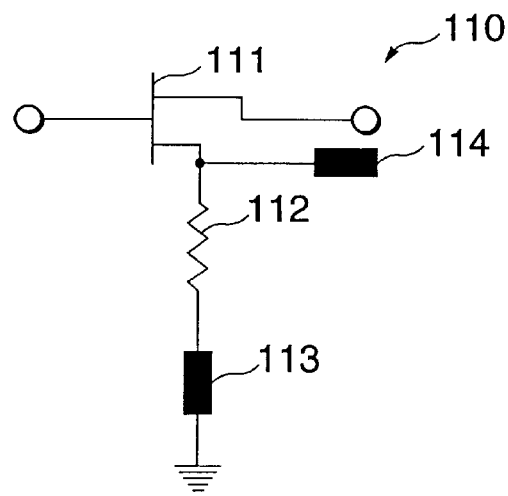
FIG. 21 is the circuit diagram for indicating the microwave amplifier according to the first prior art.
Figure 22:
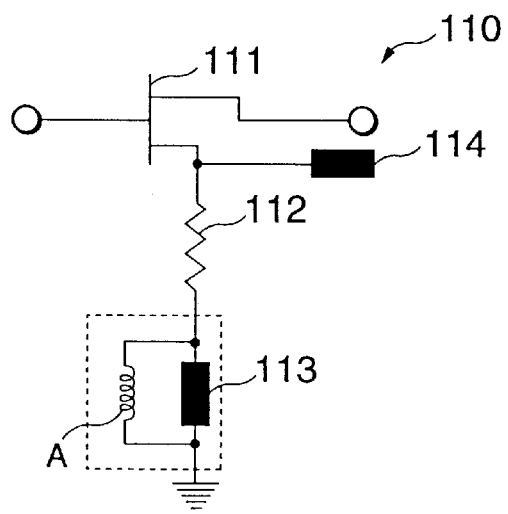
FIG. 22 is the equivalent circuit diagram of the microwave amplifier according to the first prior art.
Figure 23:
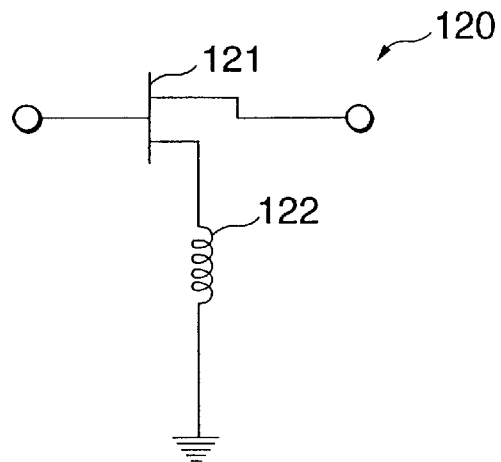
FIG. 23 is the circuit diagram for indicating the low noise amplifier according to the second prior art.
Figure 24:
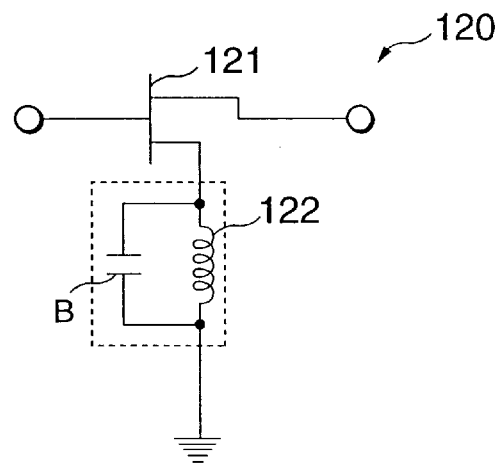
FIG. 24 is the equivalent circuit diagram of the low noise amplifier according to the second prior art.

Next, a microwave amplifier according to an embodiment mode 10 will now be explained with reference to FIG. 19. In this drawing, reference numeral 100 shows a source grounded type microwave amplifier; reference numeral 101 indicates an FET; reference numeral 102 represents an inductor loaded between a source electrode of the FET 101 and the ground; reference numeral 103 indicates a resistor connected to a gate electrode of the FET 101 and an input terminal; and reference numeral 104 represents a bias circuit connected between the input terminal and the ground. In this case, the bias circuit 104 is equipped with an RF choke inductor 105, a bypass capacitor 106, and a bias terminal 107. One end of the RF choke coil 105 is connected to the input terminal. One end of the bypass capacitor 106 is connected to the RF choke inductor 105, and the other end thereof is grounded. The bias terminal 107 is connected between the RF choke inductor 105 and the bypass capacitor 106.

Next, operations will now be explained. A signal applied to the source electrode is amplified by the FET 101, and then the amplified signal is derived from a drain electrode of the FET 101. Since the inductor 102 is loaded between the source electrode of the FET 101 and the ground, an input impedance capable of minimizing noise of the FET 101 can be located in the vicinity of an impedance capable of minimizing a reflection of the FET 101, and both a noise characteristic and a reflection characteristic can be improved at the same time.

Also, since the inductor 102 is formed on either a semiconductor chip or a semiconductor substrate, as shown in FIG. 18, the inductor 102 contains a stray capacitance component B. As a consequence, the inductor 102 is brought into such a condition that this inductor is connected in parallel to the capacitor, so that a parallel resonant circuit 108 resonated at a frequency "f0" is arranged by the inductor 102 and the stray capacitance component B.

As a consequence, in such a case that the microwave amplifier 100 is used at a frequency "f0", the inductor 102 is resonated by the stray capacitance component "B", the parallel resonant circuit 108 constructed of the inductor 102 and the stray capacitance component B is brought into an open state. However, since the resistor 103 is series-connected to the gate electrode of the FET 101 and the bias voltage is applied to the gate electrode of the FET 101 from the bias circuit 104, even when the parallel resonant circuit 108 is opened, the operation of the microwave amplifier 100 may be stabilized. Also, since no resistor is connected to the source electrode of the FET 101, an occurrence of noise caused by the resistor connected to the source electrode can be suppressed.

Also, since the resistor 103 is series-connected to the drain electrode of the FET 101, the operation of the microwave amplifier 100 may be stabilized over the entire frequency range without any frequency selection. As a consequence, the microwave amplifier 100 may become such a low noise amplifier operable under stable condition, while the noise characteristic is substantially not deteriorated.

INDUSTRIAL FEASIBILITY

As previously described, the microwave amplifier according to the present invention may be usefully used as a microwave amplifier employed in a fixed station of a communication apparatus, or in a portable terminal. In particular, this microwave amplifier is suitable for a receiving amplifier which requires a stable characteristic under low noise.

What is claimed is:

1. A microwave amplifier arranged by employing a field-effect transistor, wherein:

a first inductor and a stabilizing circuit are loaded in a parallel manner between a source electrode of said field-effect transistor and ground; and said stabilizing circuit is equipped with a second inductor and a resistor series-connected to said second inductor, said second inductor is resonated at a frequency different from another frequency at which said first inductor is resonated by a stray capacitance component.

2. A microwave amplifier arranged by employing a field-effect transistor, wherein:

a first inductor and a stabilizing circuit are loaded in a parallel manner between a source electrode of said field-effect transistor and ground;

said stabilizing circuit is equipped with a resonant unit in which a second inductor is parallel-connected to a capacitor, and a resistor series-connected to said resonant unit; and said resonant unit is resonated at a frequency different from another frequency at which said first inductor is resonated by a stray capacitance component.

* * * * *